United States Patent [19]

Suzuki

[11] Patent Number: 4,973,974
[45] Date of Patent: Nov. 27, 1990

[54] MULTI-STAGE ANALOG-TO-DIGITAL CONVERTING DEVICE

[75] Inventor: Kaoru Suzuki, Utsunomiya, Japan

[73] Assignee: Kabushiki Kaisha Toshiba, Kawasaki, Japan

[21] Appl. No.: 241,294

[22] Filed: Sep. 7, 1988

[30] Foreign Application Priority Data

Sep. 8, 1987 [JP] Japan ................................ 62-223109

[51] Int. Cl.⁵ ........................ H03M 1/06; H03M 1/14
[52] U.S. Cl. .................................... 341/118; 341/120; 341/156
[58] Field of Search ............... 341/118, 119, 120, 121, 341/155, 156, 158, 159, 161, 162, 163, 138, 140

[56] References Cited

U.S. PATENT DOCUMENTS

| | | | |
|---|---|---|---|
| 3,701,145 | 10/1972 | Bergin | 341/140 |
| 4,315,254 | 2/1982 | Honjyo et al. | 341/120 |
| 4,612,533 | 9/1986 | Evans | 341/120 |

FOREIGN PATENT DOCUMENTS

| | | | |
|---|---|---|---|
| 45850 | 4/1977 | Japan | 341/155 |
| 58341 | 5/1979 | Japan | 341/155 |

Primary Examiner—William M. Shoop, Jr.
Assistant Examiner—H. L. Williams
Attorney, Agent, or Firm—Finnegan, Henderson, Farabow, Garrett, and Dunner

[57] ABSTRACT

An A/D converting device includes an A/D converting section having a plurality of A/D converters arranged in multi-stages. The device further has a reference data generator, a correction value memory and a controller. The data generator sequentially generates pairs of a plurality of reference analog values and reference digital values. The memory is accessed using the digital output of the first stage A/D converter. The controller has a correction mode and an application mode. In the correction mode, the controller executes such a control as to supply the reference analog values to the A/D converting section and write into the memory a difference between an digital output value of a succeeding stage A/D converter and the reference digital values corresponding to the digital output value. In the application mode, the controller executes such a control as to read out a corrected digital value from the memory in accordance with the digital output value of the first stage A/D converter, and supply the corrected digital value, in place of value actually acquired from a preceding stage A/D converter, to the A/D converting section to be synthesized with the digital output value of the succeeding stage A/D converter.

6 Claims, 4 Drawing Sheets

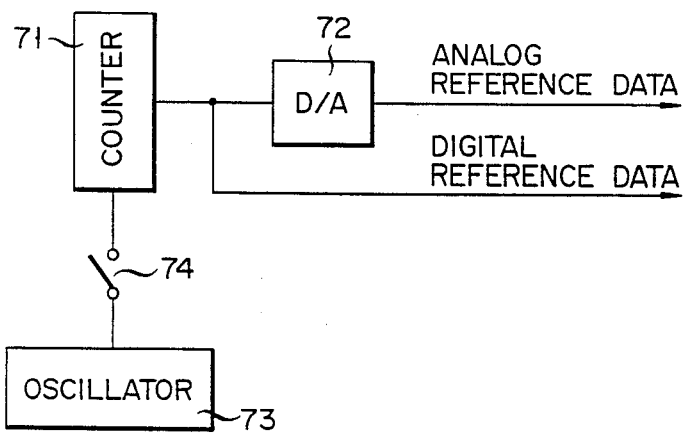
F I G. 3
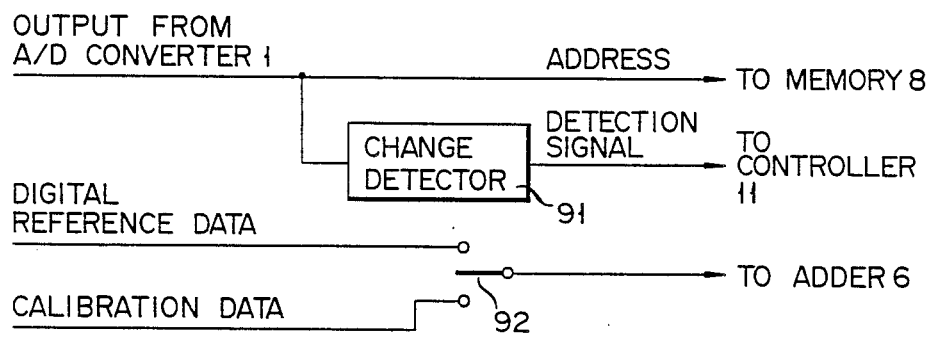
F I G. 4

MULTI-STAGE ANALOG-TO-DIGITAL CONVERTING DEVICE

BACKGROUND OF THE INVENTION

1. Field of the Invention

The present invention relates to an A/D (analog-to-digital) converting device and, more-particularly, to an A/D converting device which has so-called parallel type A/D converters arranged in two or more stages in order to provide a higher processing speed and a higher resolution.

2. Description of the Related Art

FIG. 1 is a block diagram that illustrates the arrangement of a conventional A/D converting device which comprises two or more stages of parallel type A/D converters or a conventional so-called serial-parallel type A/D converting device.

As shown in FIG. 1, an analog input is digitized in a first stage by a parallel type A/D converter 1 and as is temporarily stored in an analog data holding section 2 constituted by, for example, a sample and hold circuit or an analog delay line.

Then, an analog value that is the output of A/D converter 1 is converted by a D/A converter 3, and the original analog input values stored in analog data holding section 2 are supplied to an adder amplifier 4 constituted by, for example, an operation amplifier. This adder amplifier 4 properly amplifies the difference between these two received analog values, thereby providing an analog value corresponding to the difference between the original analog input value and the output of A/D converter 1 of the first stage.

The analog value corresponding to the difference is digitized by a parallel type A/D converter 5 of the next stage.

An adder 6 adds, and synthesizes, the output of the first stage A/D converter 1 as the higher bits and the output of the next stage A/D converter 5 as the lower bits so as to produce a digital output value with a high resolution, and sends it out to an external unit.

In other words, according to this A/D converting device, an analog input value is roughly digitized in the first stage A/D converter 1, the remaining, nondigitized analog value, i.e., the conversion error of the first stage A/D converter 1, is finely digitized in the next stage A/D converter 5, and these digital values are synthesized by adder 6. Accordingly, a combination of low-resolution A/D converters 1 and 5 can constitute a high-resolution A/D converting device, and, what is more, using high-speed parallel type A/D converters as A/D converters 1 and 5 can realize a high speed processing and a high resolution.

Although, in the example of FIG. 1, parallel type A/D converters are arranged in two stages to provide a high resolution, the same type of A/D converters may be arranged in greater stages, e.g., three, four, etc., to realize a higher resolution.

Since such a conventional A/D converting device uses many analog elements such as analog data holding section 2 and adder amplifier 4, a change in ambient temperature causes a large change in conversion accuracy. Therefore, the convention A/D converting device has a narrow temperature range for sufficient conversion accuracy, has an inevitable change in conversion accuracy with time and should reduce the yield in order to improve the accuracy, thus increasing the cost of the device.

SUMMARY OF THE INVENTION

Accordingly, it is an object of this invention to provide an A/D converting device which can maintain high accuracy in a broad temperature range, is hardly influenced by a temperature change with time, and is constructed with ease and at a low cost.

To achieve the above object, there is provided an A/D converting device having an A/D converting section comprising a plurality of A/D converters arranged in multi-stages, which device comprises:

a reference value generator for sequentially generating pairs of a plurality of correction reference analog values corresponding to idealistic input/output characteristics of an A/D converting device and correction digital values associated with the correction reference analog values;

a correction value memory accessible by address data corresponding to a digital output value of a first stage A/D converter; and a controller having correction and application modes, for, in the correction mode, executing such a control as to supply the reference analog values from the reference value generator as simulated inputs to the A/D converting section and writing into the correction value memory a difference between an digital output value of a succeeding stage A/D converter and the reference digital values corresponding to the digital output value of the succeeding stage A/D converter, and for, in the application mode, executing such a control as to read out a corrected digital value from the correction value memory in accordance with the digital output value of the first stage A/D converter, and supplying the corrected digital value, in place of a digital value actually acquired from a preceding stage A/D converter, to the A/D converting section to be synthesized with the digital output value of the succeeding stage A/D converter.

According to the A/D converting device of this invention, a variation in characteristics of analog elements due to a temperature change or with time can be timely corrected to maintain a high accuracy, thereby broadening the allowable temperature range and ensuring a stable accuracy over a long period of time.

Without the need to consider a variation in analog elements so much at the time of manufacturing, the A/D converting device of this invention can have an improved yield and can be manufactured at a low cost.

BRIEF DESCRIPTION OF THE DRAWINGS

FIG. 3 is a block diagram exemplifying the arrangement of a reference data generator in the embodiment shown in FIG. 2;

FIG. 4 is a block diagram exemplifying the arrangement of a signal processor in the embodiment shown in FIG. 2;

DETAILED DESCRIPTION OF THE PREFERRED EMBODIMENTS

Figure 2:
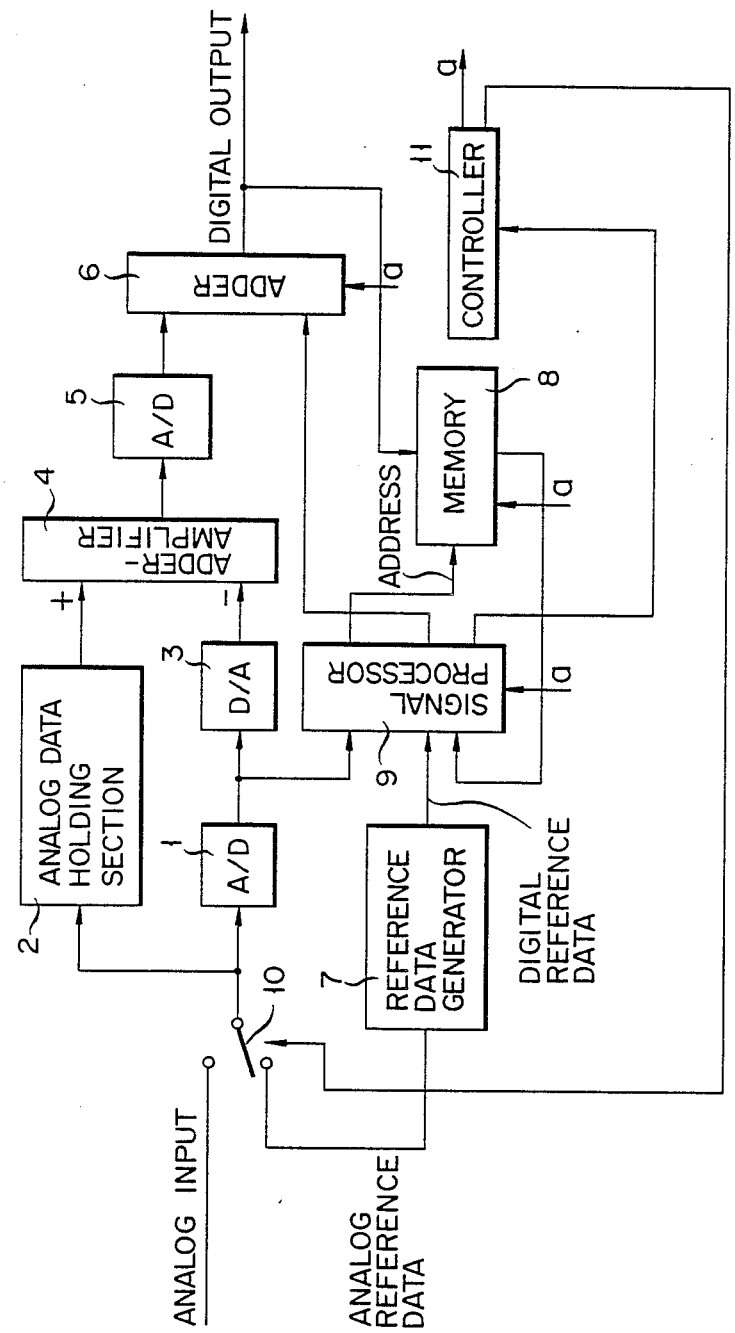
FIG. 2 is a block diagram illustrating the arrangement of an A/D converting device according to one embodiment of this invention.

FIG. 2 is a block diagram of an A/D converting device according to one embodiment of this invention.

Figure 1:
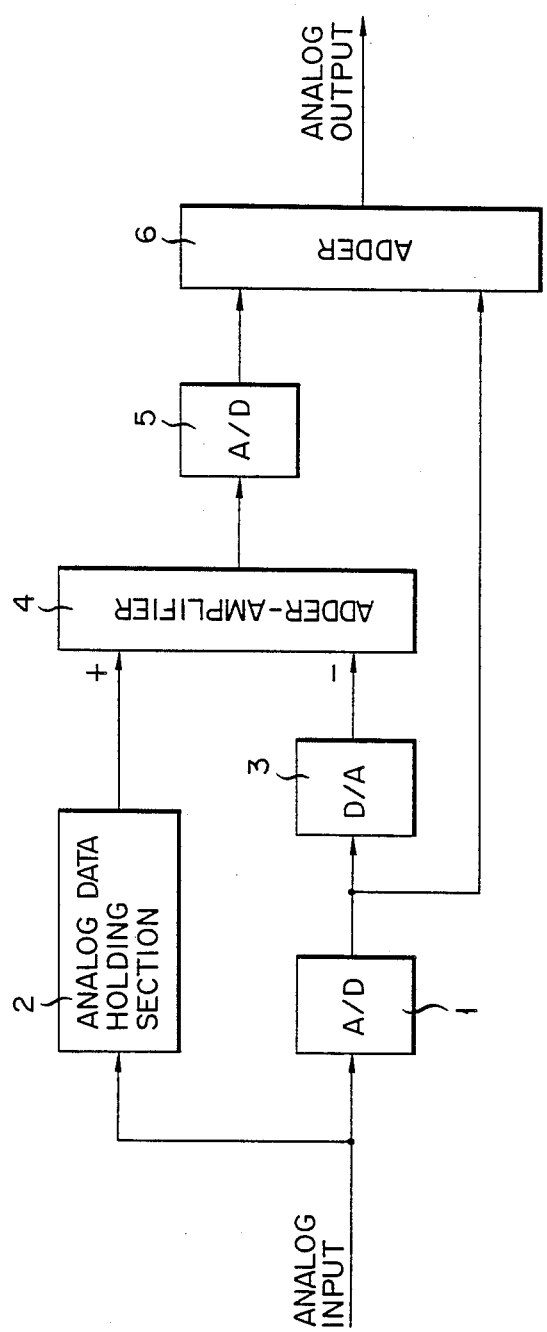
FIG. 1 is a block diagram illustrating the arrangement of an example of a conventional A/D converting device.

In FIG. 2, A/D converters 1 and 5, an analog data holding section 2, a D/A converter 3 and an adder amplifier 4 have the same structures as those shown in FIG. 1.

A reference data generator 7 is capable of sequentially generating pairs of a plurality of correction analog values, which correspond to idealistic input/output characteristics, and reference digital values as correction reference points, required in the present A/D converting device, and comprises a counter 71 for generating a reference digital value, a D/A converter 72 for converting the output of this counter into a reference analog value and an oscillator 73 which supplies a sampling clock signal to counter 71 through a switch 74, as shown in FIG. 3. The switch 74 is operated interlockingly with a switch 10 which will be described later.

A digital value memory 8, which is constituted by a random access type memory accessible for both write and read operations, has its address input supplied with the digital output of A/D converter 1 of the first stage.

Memory 8 further has a data input supplied with the digital output of adder 6, and its output data is given to a signal processor 9.

As shown in FIG. 4, signal processor 9 has abilities to send the digital output of A/D converter 1 to memory 8, to detect an increase or decrease in the digital value output from A/D converter 1 by means of a digital value change detector 91 and send a change detection signal to a controller 11, and to selectively supply the digital value from reference data generator 7 or the digital value from memory 8 to adder 6.

Switch 10 serves to switch between the original analog value and the reference analog value as an input to A/D converter 1.

Controller 11 controls the generation of the reference value from reference data generator 7, the switching between write and read accesses to memory 8, switching operation of a switch 92 of signal processor 9 and the switch operations of switch 10 and switch 74 functioning interlockingly with former switch 10, and it is constituted by an exclusive wired logic circuit or a microprocessor. A control signal a for compensation control, which is generated from controller 11, is supplied to adder 6, memory 8 and signal processor 9, as shown in FIG. 2.

With the above arrangement, adder 6 performs slightly different functions when in the correction and application modes under the control of controller 11; it subtracts the value given from signal processor 9 from the output of A/D converter 5 of the second stage in the correction mode and adds the former value to the latter in the application mode.

The operation of the A/D converting device according to this embodiment will be explained below referring to FIGS. 5 and 6 and the following Tables 1 to 3. Although analog values are normally expressed in decimal notation, for the sake of simplicity, all the values in Tables 1 to 3, analog or digital, are expressed in hexadecimal notation. (However, analog values include radix points.)

TABLE 1

| Examples Of A/D Converter Outputs | |
| --- | --- |
| Input Analog Value | Output Value of A/D Converter |
| 1.F–2.1 | 2 |
| 2.2–3.D | 3 |
| 3.E–4.4 | 4 |

TABLE 2

| Examples Of D/A Converter Outputs | |
| --- | --- |
| Input Digital Value | Output Value of D/A Converter |
| 2 | 2.4 |
| 3 | 2.B |
| 4 | 4.3 |

TABLE 3

| | | Examples Of A/D Converter Outputs And Stored Values At The Time Of Accuracy Compensation | | | | |
| --- | --- | --- | --- | --- | --- | --- |
| Reference Analog Value (a) | Reference Digital Value (b) | Output Of A/D 1 (c) | Output Of D/A 3 (d) | Output Of A/D 5 (a − d + α) × 10 (α = 1) (e) | Corrected First Stage Output (f) | Compensated Final Output (g) |
| 1.F | 1F | 2 | 2.4 | B | 14 | 1F |
| 2.1 | 21 | 2 | 2.4 | D | | 21 |
| 2.2 | 22 | 3 | 2.B | 7 | 1B | 22 |
| 3.D | 3D | 3 | 2.B | 22 | | 3D |
| 3.E | 3E | 4 | 4.3 | B | 33 | 3E |
| 4.4 | 44 | 4 | 4.3 | 11 | | 44 |

To begin with, the operation of the A/D converting device in the correction mode will now be described. The operation in this mode is performed as an initializing process executed, for example, every time power is given to the device.

Assume now that first stage A/D converter 1 and the following D/A converter 3 have the characteristics as given in the Tables 1 and 2.

Figure 5:
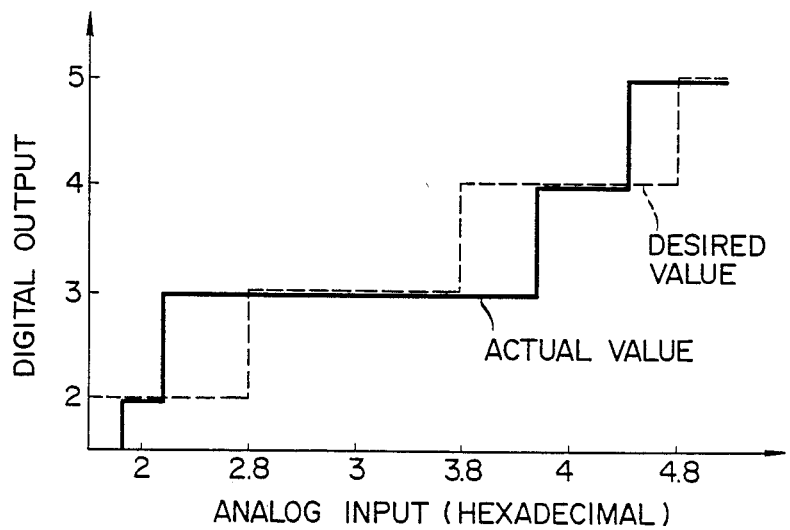
FIG. 5 is a graph exemplifying characteristics of the first/stage A/D converter in the embodiment shown in FIG. 2.
Figure 6:
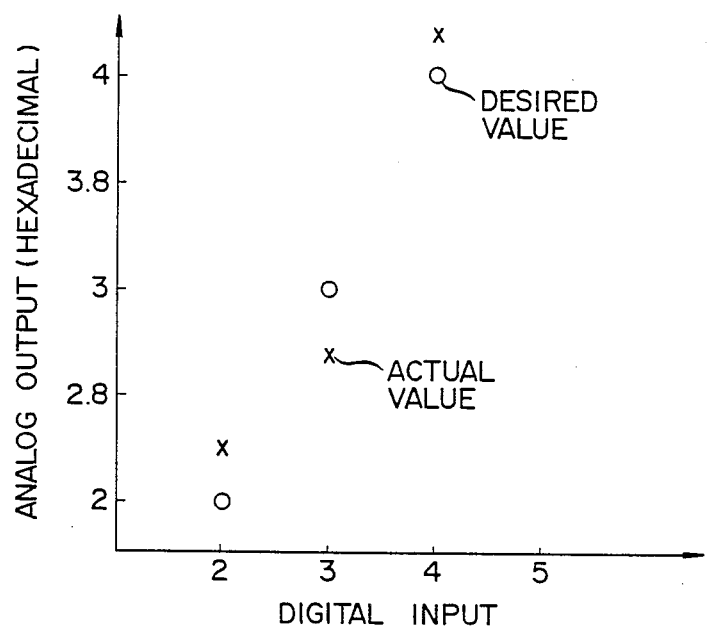
FIG. 6 is a graph exemplifying characteristics of a D/A converter in the embodiment shown in FIG. 2.

These characteristics differ slightly from the idealistic characteristics as shown in FIGS. 5 and 6, so that with analog input values simply given to the device, the final digital output values would have a significant error.

Under the above situation, when the operation in the correction mode starts, switch 10 is coupled to reference data generator 7.

Consequently, with the characteristics of A/D converter 1 and D/A converter 3 being assumed to be the idealistic characteristics shown in FIGS. 5 and 6, reference data generator 7 sequentially generates pairs of reference analog values and reference digital values which correspond to the correction reference points according to the idealistic input/output characteristics of this A/D converting device.

Table 3 illustrates six pairs of reference analog values (a) and reference digital values (b), namely, (1.F, 1F), (2.1, 21), (2.2, 22), (3.D, 3D), (3.E, 3E) and (4.4, 44).

The reference analog input values (a) are given as simulated inputs to the first parallel type A/D converter 1 through switch 10, and the reference digital output values (b) are given through signal processor to adder 6.

Adder 6 provides the difference between the digital value acquired from the second parallel A/D converter 5 and the reference digital output value from signal processor 9, and sends it as input data to memory 8.

Meanwhile the digital output of the first parallel type A/D converter 1 is given as an address to memory 8, and the aforementioned difference data is written in the area of memory 8 which is specified by the address. Through a similar process performed on each of the pairs of reference analog input values (a) and reference digital output values (b) given in Table 3, the differences between the respective pairs of (a) and (b) are written as correction values (f) at the associated addresses in memory 8.

In Table 3, 14, 1B and 33 are the corrected first stage outputs (f) as written in memory 8.

A description is now given of the operation in the application mode, in which switch 10 is coupled to the original analog input side that is the target for measurement.

First A/D converter 1 and the following D/A converter 3 execute A/D and D/A conversions according to the actual characteristics shown in FIGS. 5 and 6 and provide the individual output values (c) and (d) (see Table 3) including errors.

Adder amplifier 4 then executes an operation to amplify, to ten times, the proper offset α added to the analog input value (a) minus the analog output value (d) of D/A converter 3, thus providing an analog value corresponding to the difference between the reference analog input value (a) and the output value (c) of the first parallel type A/D converter 1.

This analog value is digitized in the succeeding parallel type A/D converter 5 to be the digital output value (e) which correspond to the upper bits of the digital output of the device.

Meanwhile, the digital output of the first stage parallel type A/D converter 1 is supplied as an address to memory 8. As a result, the correction value (f) stored at the address is read out from memory 8, and this correction value (f) is supplied as the lower bit digital output to adder 6 through signal processor 9.

Consequently, adder 6 receives the upper bit digital output value (e) from second A/D converter 5 and the correction value (f) from signal processor 9, and adds these values to provide a final output digital value according to the idealistic input/output conversion characteristics.

Given now that, as illustrated in Table 3,
Reference analog input value (a)=1.F,
Reference digital output value (b)=1F,
Digital output value of A/D converter 1=2,
Analog output value (d) of D/A converter 3=2.4,
Digital output value (e) of succeeding A/D converter 5=B, and
Corrected first stage digital output value (f)=14, adder 6 performs the operation ((e)+(f)=B+14=1F) so as to provide the final digital output value (g) which should be noted to completely coincide with the reference digital output value (b) on the idealistic input/output characteristic curve shown in FIG. 5.

According to the present A/D converting device, as described above, even if first stage A/D converter 1 and the following D/A converter 3 have some deviation in the idealistic characteristics with time or due to the influence of the ambient temperature, the operation in the application mode is executed prior to the actual use of the A/D converting device so as to correct the digital output value of A/D converter 1, thus always ensuring a digital output satisfying the idealistic input/output characteristic.

Further, in assembling the device, it is not necessary to severely control a change in functional accuracies of A/D converter 1 and D/A converter 3 due to a variation in analog elements constituting the converters. This can improve the yield as compared with the conventional A/D converting device and can reduce the manufacturing cost accordingly.

Needless to say, this invention is not limited to have the arrangement as shown in FIG. 2; the A/D converting device according to this invention may have a multi-stage arrangement having three or more stages of A/D converters. Moreover, A/D converters may be of other types than the parallel type.

What is claimed is:

1. An A/D converting device having an A/D converting section comprising a plurality of A/D converters arranged in a plurality of stages, said device comprising:
reference value generator means for sequentially generating a plurality of reference analog values and reference digital values associated with said reference analog values, corresponding to preferred input/output characteristics of said A/D converting device;
correction value memory means accessible by address data corresponding to a digital output value of a first stage A/D converter arranged in a first stage of the plurality of stages; and
controller means having correction and application modes, for, in said correction mode, executing such a control as to supply said reference analog values from said reference value generator means as simulated inputs to said A/D converting section and write into said correction value memory means a difference between a digital output value of a first A/D converter which succeeds to a second A/D converter arranged in one of the plurality of stages and said reference digital values corresponding to said digital output value of said first A/D converter, and for, in said application mode, executing such a control as to read out a correction digital value from said correction value memory means in accordance with said digital output value of said first stage A/D converter, and supply said correction digital value, in place of a digital value actually acquired from said second A/D converter, to said A/D converting section to be synthesized with said digital output value of said first A/D converter.

2. The A/D converting device according to claim 1, wherein said plurality of A/D converters include a parallel type A/D converter.

3. The A/D converting device according to claim 1, wherein said reference value generator means includes:
clock generator means for generating a clock signal;

counter means for counting said clock signal and generating a digital value; and D/A converter means for converting said digital value from said counter means into an analog value.

4. An A/D converting device comprising:

a first A/D converter for converting an analog input value into a digital value;

D/A converter means for converting a digital output value of said first A/D converter into an analog value;

analog value memory means for temporarily storing said analog input value;

differential amplifier means for detecting and amplifying a difference between said analog value stored in said analog value memory means and an analog value from said D/A converter means;

a second A/D converter for converting an analog output value of said differential amplifier means into a digital value;

synthesizing means for adding and synthesizing said digital output value of said first A/D converter and a digital output value of said first A/D converter;

reference value generator means for sequentially generating a plurality of reference analog values and reference digital values associated with said reference analog values, corresponding to preferred input/output characteristics of said A/D converting device;

correction value memory means accessible by address data corresponding to a digital output value of a first stage A/D converter; and controller means having correction and application modes, for, in said correction mode, executing such a control as to supply said reference analog values from said reference value generator means as simulated inputs to said first A/D converter and said analog value memory means and write into said correction value memory means a difference between said digital output value of said second A/D converter and said reference digital values corresponding to said digital output value of said second A/D converter, and for, in said application mode, executing such a control as to read out a correction digital value from said correction value memory means in accordance with said digital output value of said first A/D converter, and supply said correction digital value, in place of a digital value actually acquired from said first A/D converter, to said synthesizing means.

5. The A/D converting device according to claim 4, wherein said first and second A/D converters include a parallel type A/D converter.

6. The A/D converting device according to claim 4, wherein said reference value generator means includes:

clock generator means for generating a clock signal;

counter means for counting said clock signal and generating a digital value; and D/A converter means for converting said digital value from said counter means into an analog value.

* * * * *